(12) United States Patent
Liang et al.

(10) Patent No.: US 10,522,361 B2
(45) Date of Patent: Dec. 31, 2019

(54) ATOMIC LAYER DEPOSITION METHOD

(71) Applicant: National Tsing Hua University, Hsinchu (TW)

(72) Inventors: Zheng-Yong Liang, Kaohsiung (TW); Chao-Hui Yeh, Yunlin County (TW); Jui-Hsiung Liu, Taipei (TW); Po-Wen Chiu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 16/106,006

(22) Filed: Aug. 21, 2018

(65) Prior Publication Data

US 2019/0362979 A1 Nov. 28, 2019

(30) Foreign Application Priority Data

May 28, 2018 (TW) .............................. 107118199 A

(51) Int. Cl.
 *H01L 21/285* (2006.01)
 *H01L 21/768* (2006.01)
 *C23C 16/455* (2006.01)

(52) U.S. Cl.
 CPC .. *H01L 21/28556* (2013.01); *C23C 16/45536* (2013.01); *H01L 21/76879* (2013.01); *H01L 21/76883* (2013.01)

(58) Field of Classification Search
 CPC ......... H01L 21/28556; H01L 21/76883; H01L 21/76879; C23C 16/45536
 See application file for complete search history.

(56) References Cited

U.S. PATENT DOCUMENTS

| | | | |
|---|---|---|---|
| 6,095,085 | A | 8/2000 | Agarwal |
| 6,451,119 | B2 | 9/2002 | Sneh et al. |
| 7,638,170 | B2 | 12/2009 | Li |
| 7,798,096 | B2 | 9/2010 | Mahajani et al. |

(Continued)

FOREIGN PATENT DOCUMENTS

| | | |
|---|---|---|
| CN | 105390438 | 3/2016 |
| TW | 201220367 | 5/2012 |

(Continued)

OTHER PUBLICATIONS

N. Deo, et al., "Study of magnetic properties of thin cobalt films deposited by chemical vapour deposition", Journal of materials science: materials in electronics, vol. 16, issue 7, Jul. 2005, pp. 387-392.

(Continued)

*Primary Examiner* — Joseph C. Nicely
(74) *Attorney, Agent, or Firm* — JCIPRNET

(57) ABSTRACT

An atomic layer deposition method is provided. The atomic layer deposition method includes the following steps. A substrate is placed in a reaction chamber. At least one deposition cycle is performed to deposit a metal film on the substrate. The at least one deposition cycle includes the following steps. A metal precursor is introduced in the reaction chamber. A hydrogen plasma is introduced to be reacted with the metal precursor adsorbed on the substrate to form the metal film. An annealing process is performed on the metal film. The at least one deposition cycle is performed in a hydrogen atmosphere under UV light irradiation.

12 Claims, 8 Drawing Sheets

(56) References Cited

U.S. PATENT DOCUMENTS

| | | | |
|---|---|---|---|
| 9,978,610 B2* | 5/2018 | Fung | H01L 21/32136 |
| 2009/0246952 A1* | 10/2009 | Ishizaka | C23C 16/34 |
| | | | 438/653 |
| 2013/0171822 A1* | 7/2013 | Chandrashekar | |
| | | | H01L 21/28556 |
| | | | 438/675 |
| 2013/0260555 A1* | 10/2013 | Zope | H01L 21/4846 |
| | | | 438/660 |
| 2016/0032454 A1* | 2/2016 | Gatineau | C23C 16/18 |
| | | | 427/576 |
| 2016/0083842 A1* | 3/2016 | Niu | C23C 16/45536 |
| | | | 427/576 |
| 2016/0148806 A1* | 5/2016 | Henri | H01L 21/0217 |
| | | | 438/775 |
| 2016/0343612 A1* | 11/2016 | Wang | H01L 21/76862 |
| 2017/0040214 A1 | 2/2017 | Lai et al. | |
| 2018/0102244 A1* | 4/2018 | Satoh | H01L 21/02274 |
| 2018/0286746 A1* | 10/2018 | Na | H01L 21/76843 |
| 2019/0078203 A1* | 3/2019 | Liu | C23C 16/42 |
| 2019/0096673 A1* | 3/2019 | Lee | H01L 21/67207 |

FOREIGN PATENT DOCUMENTS

| | | |
|---|---|---|
| TW | I570263 | 2/2017 |
| TW | 201719756 | 6/2017 |

OTHER PUBLICATIONS

Ana R. Ivanova, et al., the abstract of "The Effects of Processing Parameters in the Chemical Vapor Deposition of Cobalt from Cobalt Tricarbonyl Nitrosyl", Journal of the Electrochemical Society, vol. 146, issue 6, Dec. 22, 1998, p. 2139.

"Office Action of Taiwan Counterpart Application," dated Jul. 29, 2019, p. 1-p. 7.

* cited by examiner

ATOMIC LAYER DEPOSITION METHOD

CROSS-REFERENCE TO RELATED APPLICATION

This application claims the priority benefit of Taiwan application serial no. 107118199, filed on May 28, 2018. The entirety of the above-mentioned patent application is hereby incorporated by reference herein and made a part of this specification.

BACKGROUND OF THE INVENTION

Field of the Invention

The invention relates to film forming method, and more particularly, to atomic layer deposition method.

Description of Related Art

As the integration density of semiconductor elements continues to increase, the demand for the density and surface flatness of the semiconductor element film is also increased. Moreover, how to avoid the drawback of holes and seams formed during the forming of a film in a trench or a hole having a very high aspect ratio is an urgent issue to be solved.

SUMMARY OF THE INVENTION

The invention provides an atomic layer deposition method that forms a high-density film and has good filling capability. No holes or seams are formed even when a film is formed in a trench or a hole having a very high aspect ratio.

An exemplary embodiment of the invention provides an atomic layer deposition method. The atomic layer deposition method includes the following steps. A substrate is placed in a reaction chamber. At least one deposition cycle is performed to deposit a metal film on the substrate. The at least one deposition cycle includes the following steps. A metal precursor is introduced in the reaction chamber. A hydrogen plasma is introduced to be reacted with the metal precursor adsorbed on the substrate to form the metal film. An annealing process is performed on the metal film. The at least one deposition cycle is performed in a hydrogen atmosphere under UV light irradiation.

In an embodiment of the invention, in the at least one deposition cycle, after the metal precursor is introduced and before the hydrogen plasma is introduced, a first purge gas is provided to purge the metal precursor not adsorbed on the substrate out of the reaction chamber, wherein the hydrogen is used as the first purge gas.

In an embodiment of the invention, in the at least one deposition cycle, after the hydrogen plasma is introduced, a second purge gas is further introduced to purge a reaction byproduct of the hydrogen plasma and the metal precursor and unreacted hydrogen plasma out of the reaction chamber, wherein the hydrogen is used as the second purge gas.

In an embodiment of the invention, the wavelength range of the UV light is 160 nm to 280 nm.

In an embodiment of the invention, when the at least one deposition cycle is performed, the substrate is heated to 180° C. to 350° C.

In an embodiment of the invention, the temperature of the annealing process is 250° C.

In an embodiment of the invention, the metal film includes cobalt, and the metal precursor includes $Co(CO)_3(NO)$.

In an embodiment of the invention, in the metal film, the atomic percentage of the cobalt is greater than 96.5%.

In an embodiment of the invention, the film thickness of the metal film is 5 nm, the surface roughness RMS of the metal film is 0.6 nm, and the metal grain size range of the metal film is 2.5 nm to 3 nm.

In an embodiment of the invention, the film thickness of the metal film is 100 nm, the surface roughness RMS of the metal film is 7.1 nm, and the metal grain size range of the metal film is 22 nm to 25 nm.

In an embodiment of the invention, after the annealing process is performed, a resistivity of the metal film at a thickness of 55 nm is 10 $\mu\Omega\cdot$cm to 13 $\mu\Omega\cdot$cm.

In an embodiment of the invention, the metal film is conformally filled in the trench, and the aspect ratio of the trench is 12:1.

An exemplary embodiment of the invention provides a cobalt metal film, wherein the cobalt metal film has a thickness of 55 nm, a surface roughness of 5.6 nm, and a resistivity of 10 $\mu\Omega\cdot$cm to 13 $\mu\Omega\cdot$cm.

Based on the above, the atomic layer deposition method with UV light irradiation of an embodiment of the invention provides higher metal purity and better flatness to the resulting film, and the metal grains are not readily aggregated and have smaller grain size, and therefore the density and filling capability of the film are increased. Moreover, the electrical properties of the metal film are also improved.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
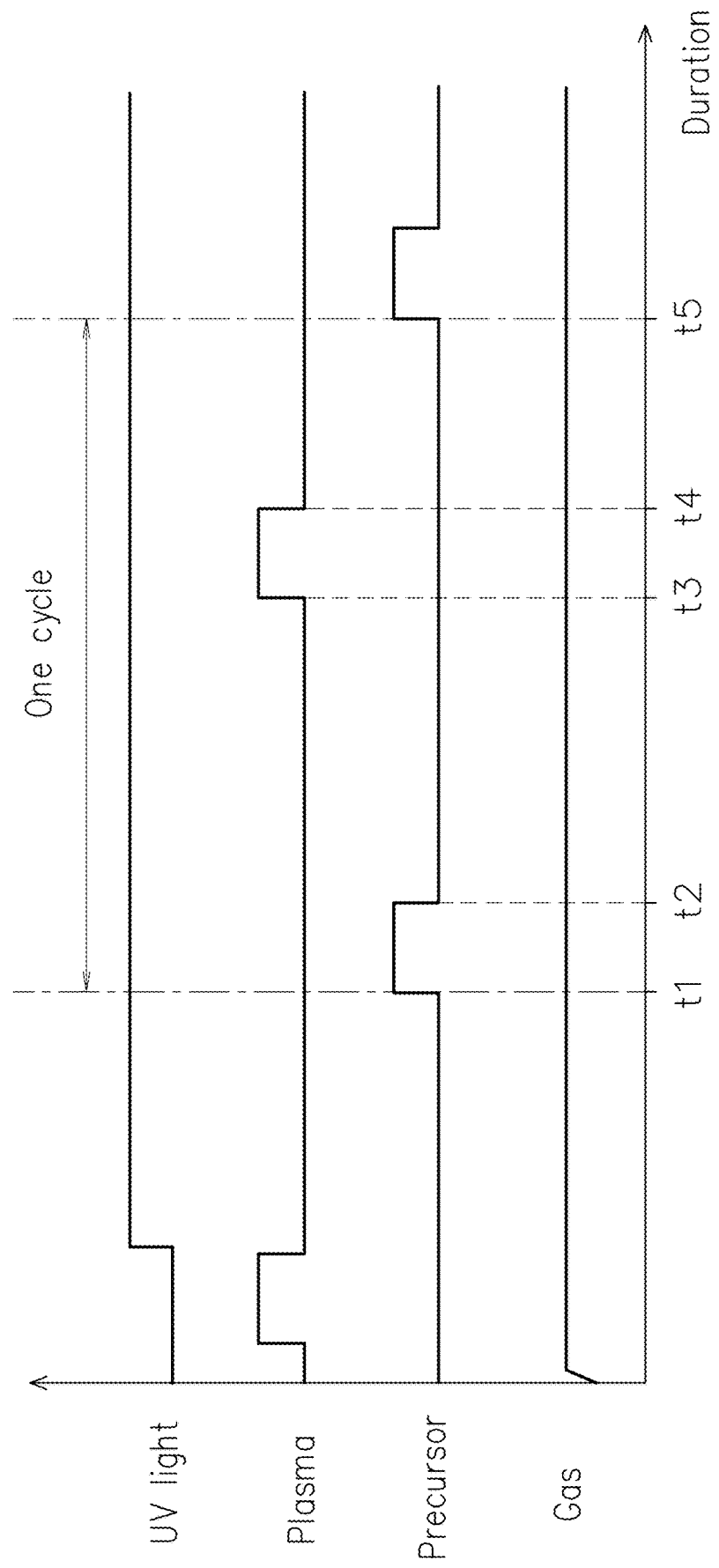
FIG. 1 is a sequence diagram of a selective atomic layer deposition method based on an embodiment of the invention.

In an embodiment of the invention, additional energy is provided in the process of forming a film on a substrate, the additional energy includes beam or electron beam irradiation. The beam is UV light, visible light, or a combination thereof. For convenience, UV light is exemplified below, but the invention is not limited thereto.

The atomic layer deposition method based on an embodiment of the invention includes turning a reaction chamber into a vacuum state. The degree of vacuum of the reaction chamber is $1\times10^{-6}$ Torr or less. In some embodiments, the reaction chamber is kept at a medium vacuum state. The medium vacuum state is, for instance, $1\times10^{-3}$ Torr to 1 Torr. In an exemplary embodiment, the degree of vacuum of the reaction chamber is about $2\times10^{-2}$ Torr. In some embodiments, the reaction chamber is made into a medium vacuum state via a mechanical pump.

After the reaction chamber reaches a predetermined degree of vacuum, a substrate is placed in the reaction chamber. In some embodiments, the material of the substrate includes, but is not limited to, a semiconductor material, conductor material, insulating material, or a combination thereof. In some embodiments, the substrate includes, for instance, TaN/Si.

Before the deposition reaction is performed, the substrate is heated to the desired temperature. In some embodiments, the temperature range of the substrate is 180° C. to 350° C., but the invention is not limited thereto. In some other embodiments, the temperature range of the substrate is 160° C. to 250° C. The temperature of the substrate is adjusted based on, for instance, the substrate type, the type of the film to be deposited, and the desired deposition rate. It should be understood that, the temperature of the substrate refers to the growth temperature of the film to be deposited.

In some embodiments, the power supply of the reaction chamber is about 100 W to 300 W. In another embodiment, the power supply is about 200 W.

The atomic layer deposition method includes introducing a precursor in the reaction chamber. The precursor may be one or more types. The precursor may be a gas, liquid, or solid at room temperature. The temperature of the precursor provided in the reaction chamber is 10 degrees Celsius to 80 degrees Celsius, but the invention is not limited thereto. In some embodiments, the precursor is introduced in the reaction chamber in a pulse manner. The duration of the introduction of the precursor in the reaction chamber is, for instance, 0.05 seconds to 0.5 seconds.

When the precursor is introduced in the reaction chamber or before the precursor is introduced in the reaction chamber, a UV light is provided in the reaction chamber such that the precursor introduced in the reaction chamber is irradiated by the UV light. In other words, in some embodiments, before plasma is provided in the reaction chamber, UV light irradiation is first performed on the precursor, or UV light irradiation is provided after the precursor enters the reaction chamber such that a physical reaction or chemical reaction occurs to the precursor. The UV light is provided in the reaction chamber in a continuous or pulse manner. In some embodiments, the wavelength range of the UV light is, for instance, 160 nm to 280 nm.

After the precursor is introduced in the reaction chamber and irradiated by UV light, plasma is provided in the reaction chamber to make the precursor react and form a monolayer film on the substrate. However, the invention is not limited thereto. In some other embodiments, after the precursor is introduced in the reaction chamber, the plasma is provided before the UV light irradiation or provided at the same time as the UV light irradiation. The gas source of the plasma is, for instance, hydrogen, but is not limited thereto. The plasma is provided in the reaction chamber in a pulse manner. The duration of the introduction of the plasma in the reaction chamber is, for instance, 10 seconds to 15 seconds.

In the reaction chamber, in addition to the precursor, other gases may also be introduced. The other gases are used as purge gases to purge unreacted precursors or unreacted plasma. The other gases include hydrogen. The other gases are provided in the reaction chamber in a continuous or pulse manner. In some embodiments, the flow range of the other gases is, for instance, 10 sccm to 100 sccm, and the flow of the other gases during purging is greater than or equal to the flow when purging is not performed. In some embodiments, the flow rate range of the other gases during purging is 50 sccm to 100 sccm.

The various operations performed between one precursor pulse and the next precursor pulse are also referred to as one cycle of the atomic layer deposition process. In general, the forming of a film on the substrate includes performing at least one cycle. In some embodiments, the forming of a film on the substrate includes performing 200 to 1000 cycles. However, the invention is not limited thereto, and the number of cycles is adjusted based on the thickness of the film to be deposited.

Exemplary examples are provided below. FIG. 1 is a sequence diagram of selective atomic layer deposition method based on an embodiment of the invention. FIG. 1 shows an atomic layer deposition process based on an embodiment of the invention.

Referring to FIG. 1, one cycle of the atomic layer deposition starts from time t1 and ends at time t5. In some embodiments, the entire process of the atomic layer deposition is performed in a hydrogen atmosphere under a UV light irradiation. In other words, in one cycle from time t1 to time t5, the entire deposition system is exposed in UV light irradiation, and hydrogen is continuously introduced in the reaction chamber. In some embodiments, the flow of hydrogen is, for instance, 10 sccm to 100 sccm. It should be understood that, during the atomic layer deposition process, the reaction chamber and the substrate have respectively reached the desired pressure and temperature.

During the period from time t1 and time t2, the precursor of a film to be formed is introduced in the reaction chamber in which the substrate is located such that the precursor is adsorbed on the substrate. In some embodiments, the precursor enters the reaction chamber in a pulse manner. The precursor is, for instance, a metal precursor. In some embodiments in which the film to be deposited is a cobalt (Co) film, the precursor is a Co precursor, such as $Co(CO)_3(NO)$. The flow duration of the Co precursor, i.e., the duration from time t1 to time t2, is, for instance, 0.05 seconds to 0.5 seconds. In some embodiments, the temperature of the cobalt precursor is about 30 degrees Celsius.

In some embodiments, a portion of the precursor is adsorbed on the substrate via chemical adsorption, i.e., a strong chemical bond is formed between the atoms of the solid-phase surface of the substrate and the gas-phase molecules derived from the precursor. A portion of the precursor is adsorbed on the substrate via physical adsorption (such as van der Waals force). In some embodiments, the substrate is completely covered by the precursor adsorbed on the substrate, and a portion of the precursor is not adsorbed on the substrate.

Next, during the period from time t2 to time t3, the introduced hydrogen is used as a purge gas to purge the precursor not adsorbed on the substrate out of the reaction chamber. In some embodiments, since the adhesion of physical adsorption is weaker, a portion of the precursor physically adsorbed on the substrate is also purged out of the reaction chamber by the purge gas. In some embodiments, the flow of hydrogen when hydrogen is used as the purge gas is the same as or different from the flow when purging is not performed. The flow when hydrogen is used as the purge gas is, for instance, 50 sccm to 100 sccm.

Next, during the period from time t3 to time t4, hydrogen plasma is introduced in the reaction chamber. In some embodiments, the hydrogen plasma is generated via a plasma source. The plasma source is, for instance, an inductively-coupled plasma source. The hydrogen plasma generated by the plasma source includes hydrogen radicals used as reactants in the deposition reaction chamber. In some embodiments, the flow duration of the hydrogen plasma in the reaction chamber, i.e., the period from time t3 to time t4, is sustained for, for instance, 10 seconds to 15 seconds, but the invention is not limited thereto.

The precursor adsorbed on the substrate is reacted with the hydrogen plasma, and undergoes pyrolysis under UV light irradiation, thereby a film deposited on the substrate is thus formed. The film is, for instance, a metal film or an insulating film. The metal film is, for instance, a cobalt metal film. The insulating layer is, for instance, a silicon nitride film. In some embodiments in which the film to be deposited is a cobalt film, the reaction formulas of the hydrogen plasma/UV light and the cobalt precursor are shown below:

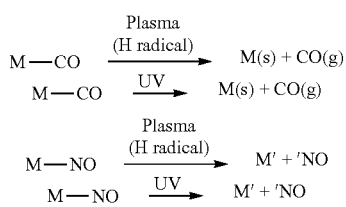

Next, during the period from time t4 to time t5, the introduced hydrogen is used as a purge gas to purge a reaction byproduct of the hydrogen plasma and the metal precursor and unreacted hydrogen plasma out of the reaction chamber.

At this point, one cycle of the deposition process is complete. In some embodiments, the time needed for one cycle of the atomic layer deposition, i.e., the period from time t1 to time t5, is 18 seconds to 36 seconds. The film thickness of the single film formed via one atomic layer deposition cycle is 0.1 nm to 0.6 nm. In some embodiments, the deposition cycle is repeated to form a multilayer stacked film until a film having the desired thickness is formed.

In an embodiment of the invention, since the deposition process contains UV light irradiation, a film having a roughness and grain size that are both only several nanometers is obtained. To more intuitively show the influence of UV light irradiation on the surface roughness and grain size of the film, a comparative example in which atomic layer deposition is performed without UV light irradiation under the same process conditions is provided. In the following, the relationship between surface roughness and metal grain size of the film and UV light irradiation, temperature, and film thickness is described via the forming of a metal film (cobalt film) as an example. It should be mentioned that, the metal grain size in the present specification is D50.

Table 1 shows the range of the individual surface roughness RMS and metal grain size of the metal films formed with and without UV light irradiation at specific temperature of different examples and comparative examples of the invention. FIG. 2A to FIG. 2D show particle size distribution diagrams of metal grains of metal films of different examples and comparative examples in Table 1 obtained using an atomic force microscope (AFM).

Example 1

Figure 2B:
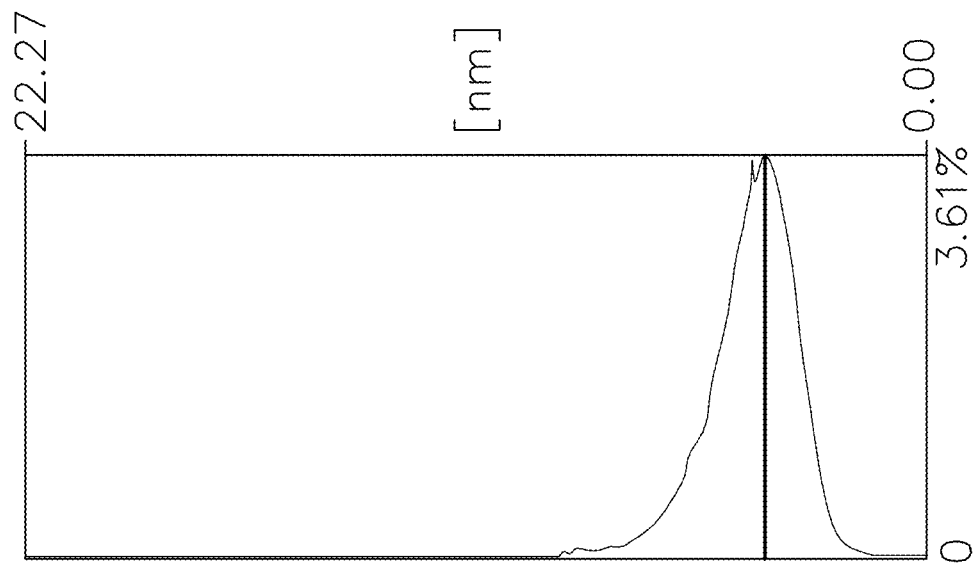
FIG. 2A to FIG. 2D are particle size distribution diagrams of metal particles of metal films of different examples or comparative examples obtained by measuring via an atomic force microscope (AFM).
Figure 2A:
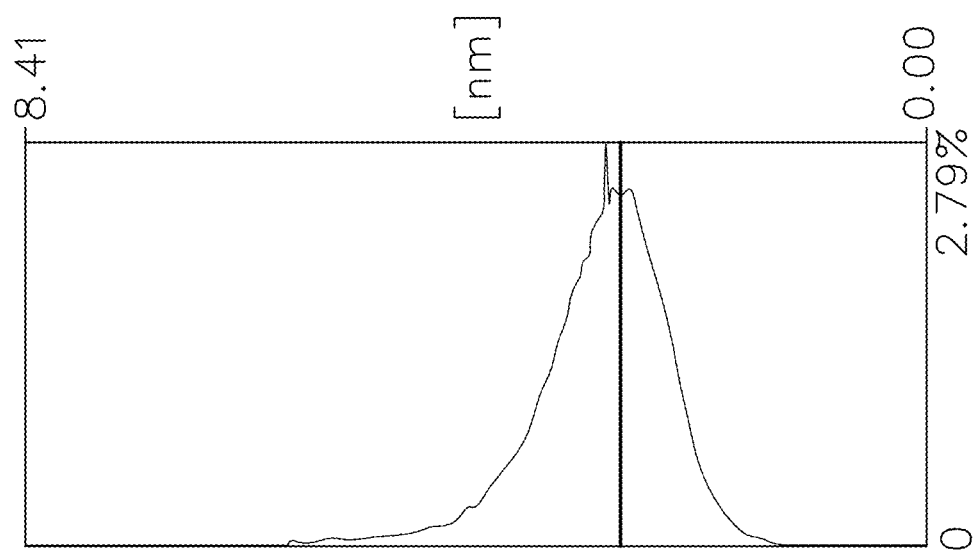

The temperature of the substrate was controlled at 180 degrees Celsius, Co(CO)$_3$(NO) was used as a precursor, and the atomic layer deposition above was performed. The temperature of Co(CO)$_3$(NO) was about 30 degrees Celsius, and the introduction duration was about 0.05 seconds to 0.5 seconds. Starting from the introduction of Co(CO)$_3$(NO), UV light was continuously provided in the reaction chamber to irradiate Co(CO)$_3$(NO) for at least 18 seconds to 36 seconds. Next, a hydrogen plasma was provided in the reaction chamber for about 10 seconds to 15 seconds. Moreover, hydrogen was continuously provided in the reaction chamber as a purge gas. The cycle was repeated until the thickness of the resulting cobalt metal film reached 10 nm. Next, a roughness test and a grain size test were performed via an atomic force microscope. The particle size distribution diagram of the metal grains in the metal film of example 1 is shown in FIG. 2A.

Examples 2 to 4

Figure 2D:
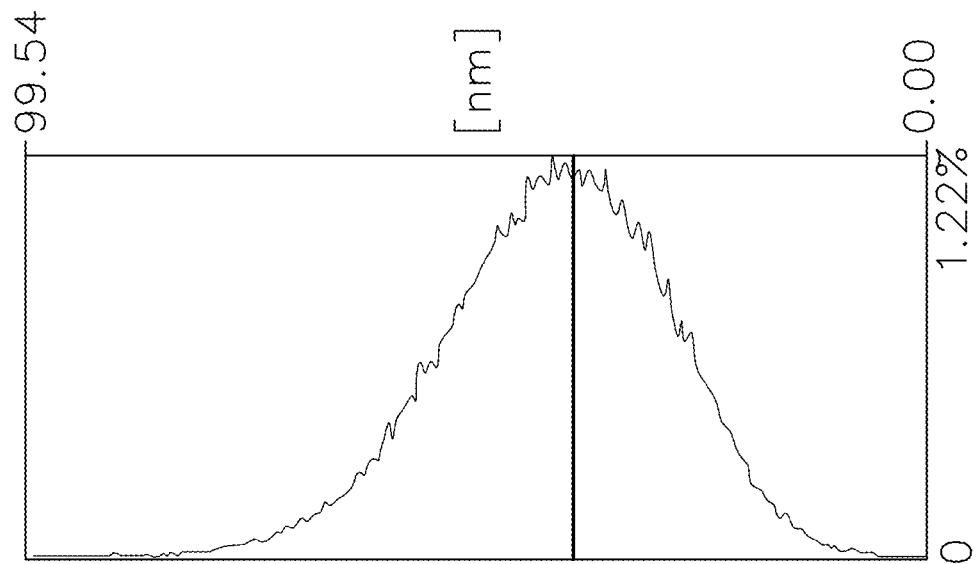
Figure 2C:
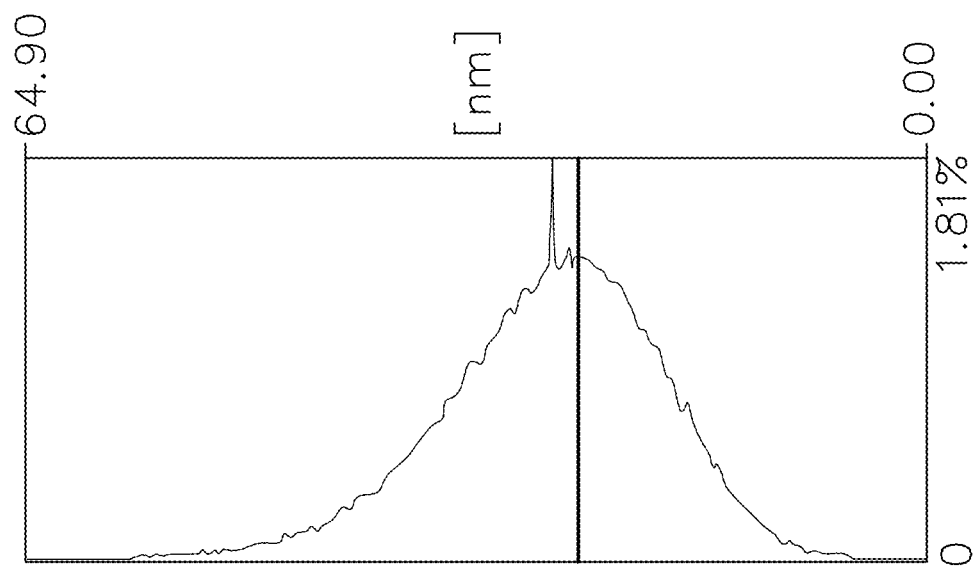

A cobalt metal film was formed in a similar manner to example 1, but in examples 2 to 4, the temperature of the substrate was respectively controlled at 200 degrees Celsius, 200 degrees Celsius, and 250 degrees Celsius, and the thicknesses of the resulting cobalt metal films were respectively 10 nm, 100 nm, and 100 nm. The particle size distribution diagram of the metal grains in the metal film of example 2 is shown in FIG. 2B. The particle size distribution diagram of the metal grains in the metal film of example 3 is shown in FIG. 2C. It should be understood that, the film thickness 100 nm in the present specification has an error of ±5 nm.

Comparative Examples 1 to 4

In comparative examples 1 to 4, a cobalt metal film was formed via a similar method to examples 1 to 4, but in comparative examples 1 to 4, UV light was not provided in the reaction chamber. In other words, UV light was not irradiated on the Co(CO)$_3$(NO) precursor. The particle size distribution diagram of the metal grains in the metal film of comparative example 3 is shown in FIG. 2D.

TABLE 1

| | Example 1 | Comparative example 1 | Example 2 | Comparative example 2 | Example 3 | Comparative example 3 |
|---|---|---|---|---|---|---|
| Reaction chamber temperature | 180° C. | 180° C. | 200° C. | 200° C. | 200° C. | 200° C. |
| UV light irradiation | Yes | No | Yes | No | Yes | No |
| Film thickness (nm) | 10 | 10 | 10 | 10 | 100 | 100 |

TABLE 1-continued

|  | Example 1 | Comparative example 1 | Example 2 | Comparative example 2 | Example 3 | Comparative example 3 |
|---|---|---|---|---|---|---|
| Surface roughness RMS (nm) | 0.6 | 0.8 | 1.1 | 4.5 | 7.1 | 12.5 |
| Metal grain size (nm) | 2.5 to 3 | 3.5 to 7 | 4 to 6 | 6.5 to 10 | 22 to 25 | 40 to 45 |

It is known from Table 1 that, when metal films having the same film thickness are formed at the same temperature, in comparison to metal films formed without UV light irradiation, metal films formed with UV light irradiation have a smoother surface, i.e., the surface roughness RMS is smaller, and the metal grain size is smaller.

The results of example 1 and example 2 of Table 1 show that, when metal films having the same film thickness (10 nm) are formed with UV light irradiation, the surface roughness RMS and the metal grain size are positively proportional to temperature. As the temperature is increased, the surface roughness RMS and metal grain size of the resulting metal film are also increased.

The results of example 2 and example 3 of Table 1 show that, under UV light irradiation and the same temperature conditions, the surface roughness RMS and metal grain size of the resulting metal film are positively proportional to film thickness. A greater film thickness of the metal film results in greater surface roughness RMS and metal grain size.

Referring to example 3 and comparative example 3 of Table 1, when a metal film having a film thickness of 100 nm is formed, under the condition of a temperature of 200° C., the surface roughness (7.1 nm) of the metal film formed with UV light irradiation is reduced by 43% in comparison to the surface roughness (12.5 nm) of the metal film formed without UV light irradiation.

It is known from examples 3 and 4 and comparative examples 3 and 4 of Table 1 that, in the deposition process of the metal film, when metal films having the same film thickness are formed under the same process conditions, UV light irradiation significantly reduces the surface roughness RMS of the metal film in a certain temperature range. However, when the temperature is higher, the effect of UV light irradiation on the reduction of surface roughness of the metal film is not significant due to the aggregate effect caused by temperature.

Table 2 shows the individual component content of the metal films formed with and without UV light irradiation when metal (such as cobalt) films having the same film thickness (100 nm) of example 3 and comparative example 3 are formed under the same process conditions (temperature of 200° C.).

TABLE 2

|  | Atomic percentage (%) | | | |
|---|---|---|---|---|
| Atom | C | O | Co | N |
| Example 3 | <1 | <2.5 | >96.5 | <1 |
| Comparative example 3 | <1 | >26.5 | >69 | >3.8 |

It is known based on Table 2 that, in a medium vacuum (2×10−2 Torr) environment, in comparison to metal films formed without the use of UV light irradiation, atomic layer deposition performed with the assistance of UV light irradiation significantly reduces oxygen and nitrogen residuals in the metal film, and therefore metal content and purity of the metal (such as cobalt) film are increased.

In some embodiments, after at least one deposition cycle is repeated to form a film having the desired thickness, an annealing process is further performed on the metal film. In an embodiment of the invention, the metal film formed by performing atomic layer deposition with UV light irradiation has good flatness, i.e., very small surface roughness, and good metal purity. Therefore, an annealing process is performed via a lower temperature and shorter time. In some embodiments, the temperature range of the annealing process is, for instance, 250° C. to 350° C. In some embodiments, the annealing process improves the quality of the electrical properties of the metal film and increases the metal grain size.

In some embodiments, before the metal film is formed, a barrier layer is formed on the substrate. In some embodiments in which the metal film is a cobalt film, the material of the barrier layer is, for instance, TaN, and the thickness of the barrier layer is, for instance, 5 nm to 30 nm, such as 5 nm. The barrier layer is formed by, for instance, atomic layer deposition or physical vapor deposition, but the invention is not limited thereto.

Example 5

A cobalt metal film was formed in a similar manner to example 1, but the temperature of the substrate was controlled at 200 degrees Celsius, and the thickness of the resulting cobalt metal film was 55 nm (with an error of +5 nm), and before the cobalt metal film was formed, a barrier layer having a film thickness of 30 nm was formed on the substrate. The material of the barrier layer was TaN. After the cobalt metal film was formed, an annealing process was performed on the cobalt metal film. The temperature of the annealing process was 250° C. The duration of the annealing process was about 15 minutes. After the annealing process, the resistivity of the cobalt metal film was measured to reach 10 Ω·cm to 13 Ω·cm, and the surface roughnesses RMS thereof before and after annealing are shown in Table 3 below. It is known from Table 3 that, after annealing, the surface roughness of the cobalt metal film is further reduced. In some embodiments, the metal grain size of the cobalt metal film after the annealing process is 36 nm.

TABLE 3

|  | Before annealing | After annealing |
|---|---|---|
| Surface roughness RMS (nm) | 6.8 | 5.6 |

Comparative Examples 5 to 6

A cobalt metal film was formed in a similar manner to example 5, but in comparative example 5, UV light was not provided in the reaction chamber, and in comparative example 6, UV light and plasma were not provided in the reaction chamber. Table 4 shows the resistivities of the cobalt metal films of example 5 and comparative examples 5 to 6 before and after annealing. It should be understood that, the numeric values in Table 4 and Table 5 are all average values. It is known from Table 4 below that, the cobalt metal film of example 5 after UV light irradiation and plasma treatment shows the best electrical property quality and has the lowest resistivity.

TABLE 4

| | Example 5 | Comparative example 5 | Comparative example 6 |
|---|---|---|---|
| UV light irradiation | Yes | No | No |
| Plasma | Yes | Yes | No |
| Resistivity before annealing ($\mu\Omega \cdot cm$) | 319 | 990 | 2120 |
| Resistivity after annealing ($\mu\Omega \cdot cm$) | 9.8 | 17.4 | 44.1 |

In some embodiments, the resistivity of the metal film is different with different temperatures and durations of the annealing process. Table 5 shows the resistivities of a cobalt metal film having a film thickness of 55 nm at different annealing temperatures, wherein when the annealing temperature is 250 degrees Celsius and the annealing duration is 15 minutes, the cobalt metal film shows the best resistivity.

TABLE 5

| | Resistivity ($\mu\Omega \cdot cm$) |
|---|---|
| Before annealing | 319 |
| after annealing at 250° C. (15 minutes) | 9.8 |
| after annealing at 350° C. (15 minutes) | 10.4 |
| after annealing at 250° C. (30 minutes) | 22.6 |

Figure 3A:
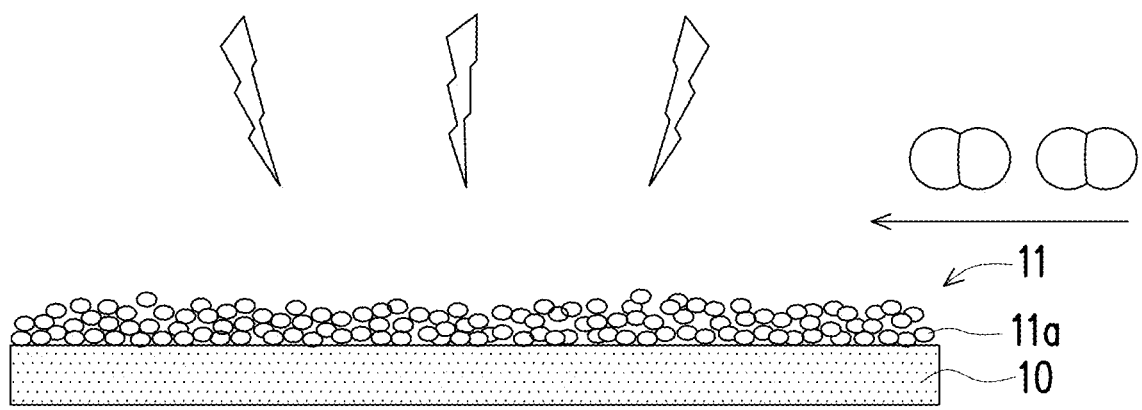
FIG. 3A shows a schematic of the deposition of a thin film on a substrate using the atomic layer deposition method of an embodiment of the invention.
Figure 3B:
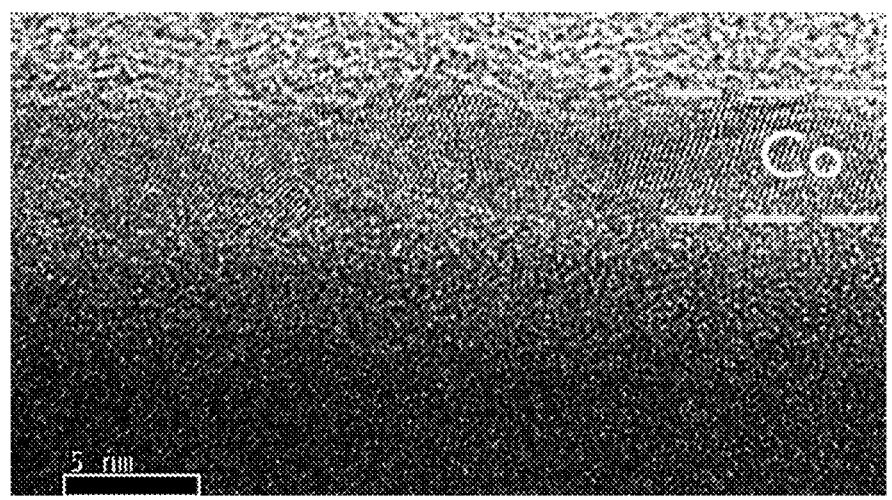
FIG. 3B shows a high-resolution transmission electron microscopy (HRTEM) image of a film formed using the atomic layer deposition method of an embodiment of the invention.

FIG. 3A shows a schematic of the deposition of a film on a substrate using the atomic layer deposition method of an embodiment of the invention. FIG. 3B shows a high-resolution transmission electron microscopy (HRTEM) image of a film formed using the atomic layer deposition method of an embodiment of the invention. Referring to FIG. 3A, in some embodiments, an atomic layer deposition process is performed with UV light irradiation in a hydrogen atmosphere to form a film 11 on a substrate 10. In some embodiments, the film 11 is a cobalt metal film having a thickness of, for instance, 5 nm, and the grain size of a metal grain 11a of the cobalt metal film is 2.5 nm to 3 nm. The surface roughness RMS of the cobalt metal film is about 0.6 nm. The HRTEM image of the cobalt metal film is as shown in FIG. 3B. As shown in FIG. 3A and FIG. 3B, the film formed by atomic layer deposition method of an embodiment of the invention has good characteristics such as high density, small surface roughness, and small grain size.

In an embodiment of the invention, by performing atomic layer deposition with UV light irradiation, the metal obtained from the deposition has smaller metal grain size and smaller surface roughness RMS, and therefore the atomic layer deposition method of an embodiment of the invention has good filling capability when forming a metal layer in a trench or a hole.

The above is an exemplary description of the forming of a metal film via atomic layer deposition, but the invention is not limited thereto.

Figure 4A:
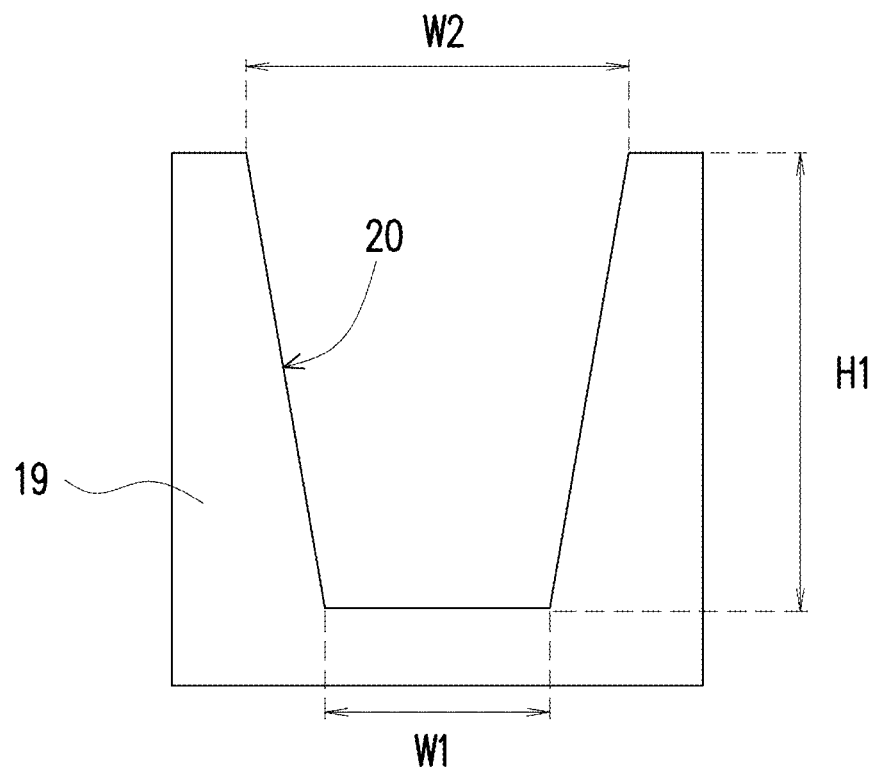
FIG. 4A to FIG. 4B show schematics of the forming of a film in an opening using the atomic layer deposition method of an embodiment of the invention.
Figure 4B:
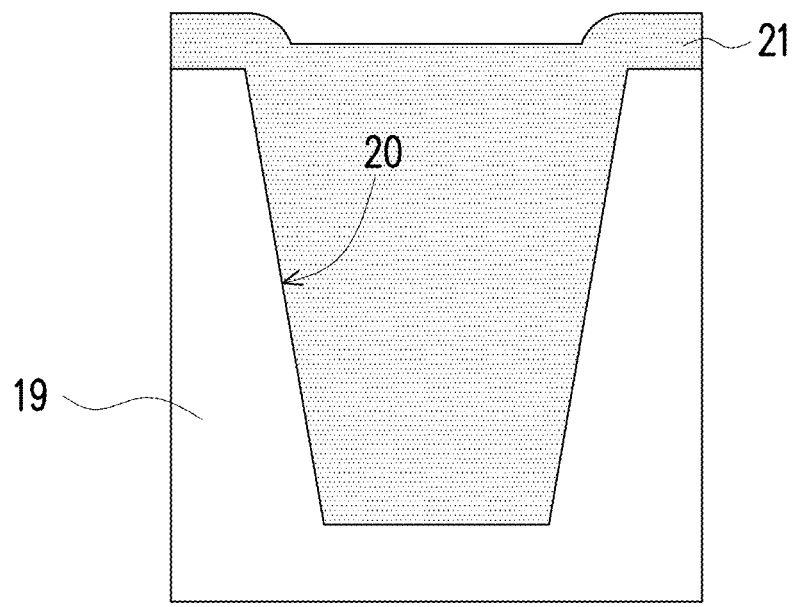
Figure 5:
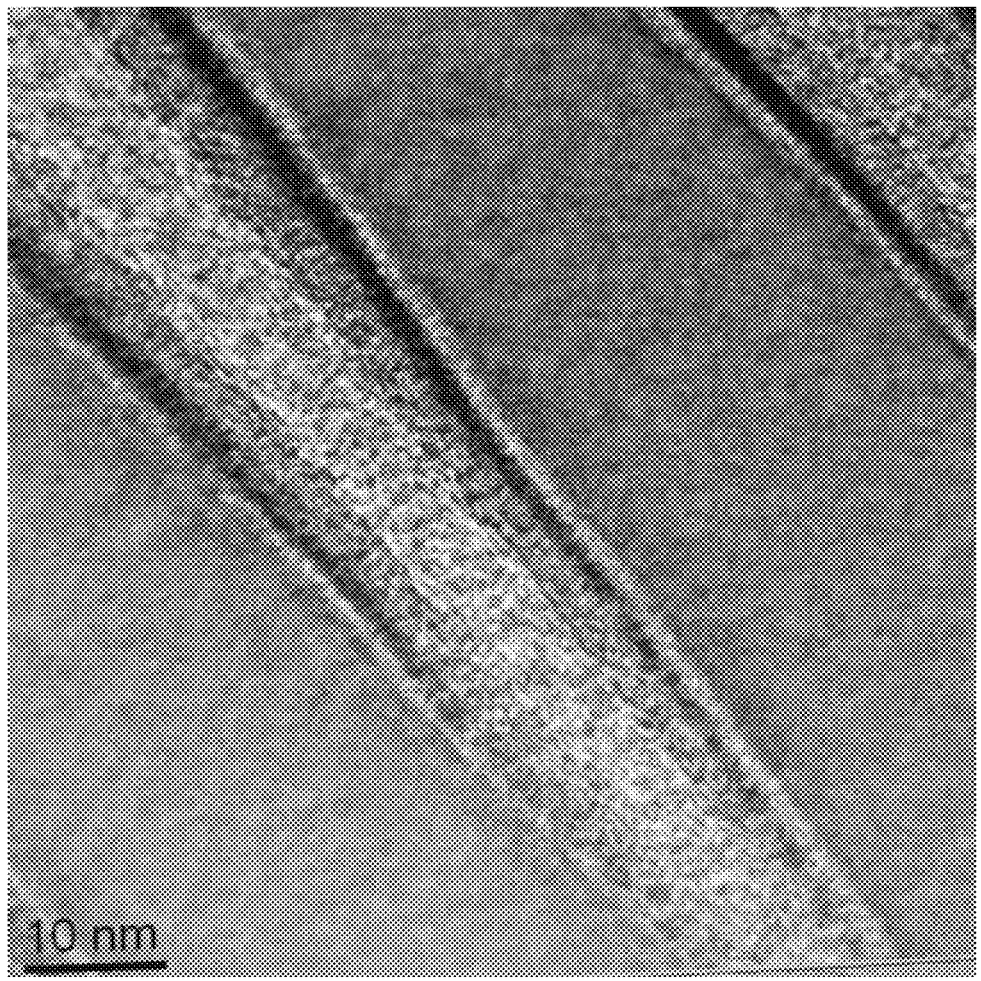
FIG. 5 shows an HRTEM image of a film formed in an opening having an aspect ratio of 12:1 using the atomic layer deposition method of an embodiment of the invention.

FIG. 4A to FIG. 4B show schematics of the forming of a film in an opening using the atomic layer deposition method of an embodiment of the invention. FIG. 5 shows an HRTEM image of a film formed in an opening having an aspect ratio of 12:1 using the atomic layer deposition method of an embodiment of the invention.

Referring to FIG. 4A, an opening 20 is, for instance, a hole, or a trench separating two strips. In some embodiments, the opening 20 is a via hole or a contact hole of a via or a contact formed in a metal interconnect in a semiconductor process. In some other embodiments, the opening 20 is a contact of a bit line or a word line formed in a stacked layer in a 3D memory element. In the present embodiment, the opening 20 is, for instance, formed in a layer 19. The layer 19 is, for instance, a dielectric layer, or a stacked layer formed by the stacking of a plurality of insulating layers and a plurality of semiconductor layers, but the invention is not limited thereto. In some embodiments, the shape of the opening 20 viewed from the top is, for instance, a circle, oval, square, rectangle, trapezoid, or any other shapes, and the cross-section shape of the opening 20 is, for instance, a square, rectangle, trapezoid, or any other shapes. In some embodiments, a top width W2 and a bottom width W1 of the opening 20 are the same or different. In some embodiments, the range of the aspect ratio of the opening 20 (height H1:bottom width W1) is 12:1 to 1:1. In an exemplary embodiment, the aspect ratio of the opening 20 is, for instance, 12:1, 6:1, 10:1, or 1:1.

Referring to FIG. 4B and FIG. 5, similar to the method above, a metal layer is formed in the opening 20 using atomic layer deposition with the assistance of UV light irradiation. In the deposition process, pyrolysis occurs to the metal precursor under UV light irradiation, such that the resulting metal layer has smaller metal grain size. As a result, the deposition rate from the bottom up in the opening 20 is faster, and a metal structure 21 without any holes or seams is conformally formed in the opening 20.

Figure 6A:
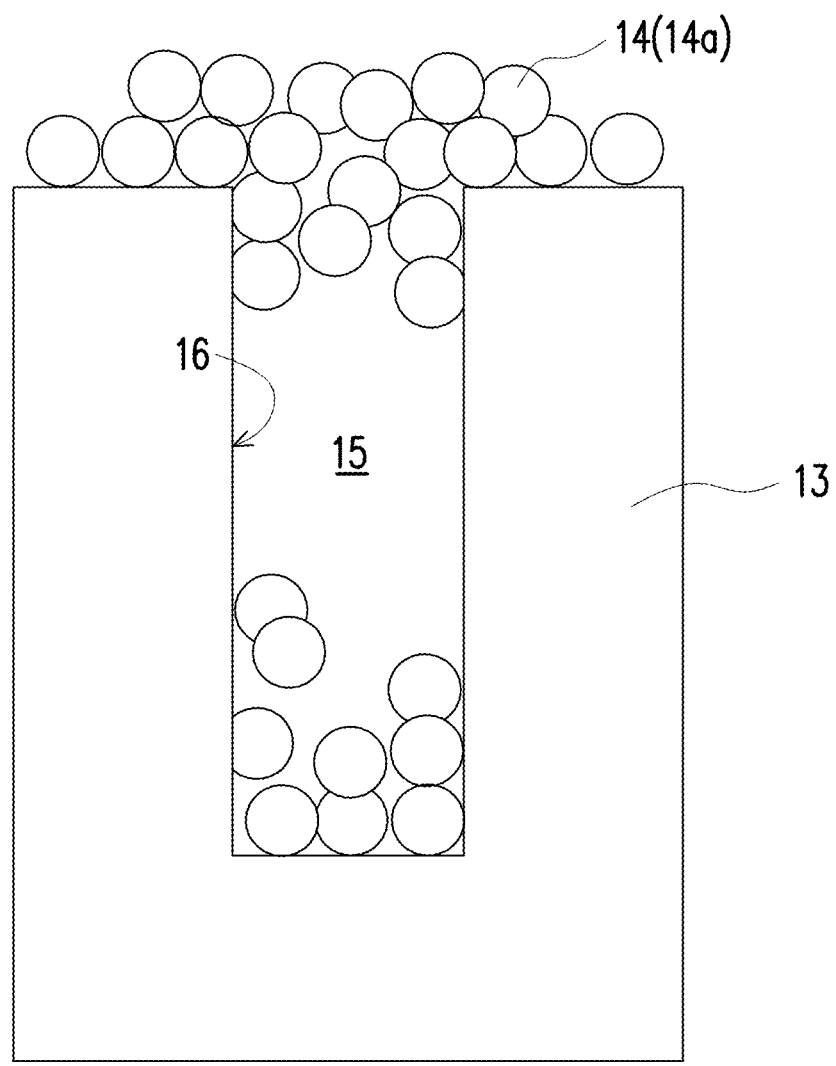
FIG. 6A shows a microscopic schematic of a film formed in a trench based on a known deposition method.
Figure 6B:
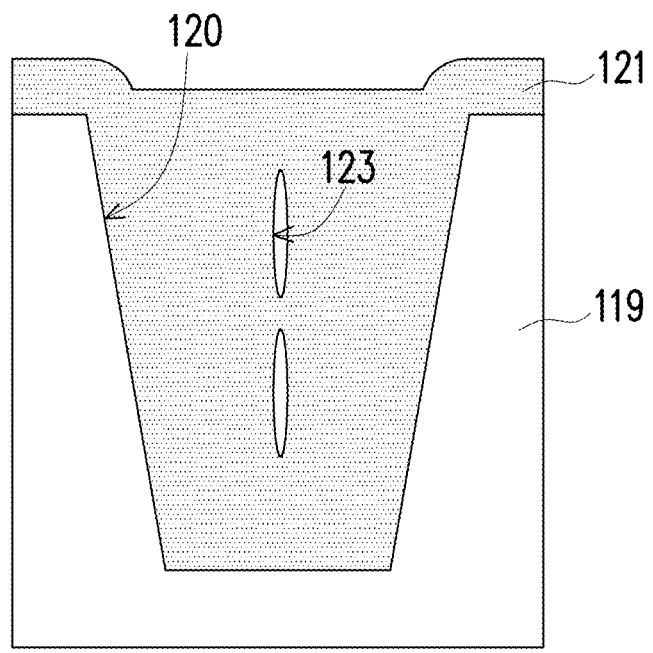
FIG. 6B and FIG. 6C show schematics of a film formed in a trench based on a known deposition.
Figure 6C:
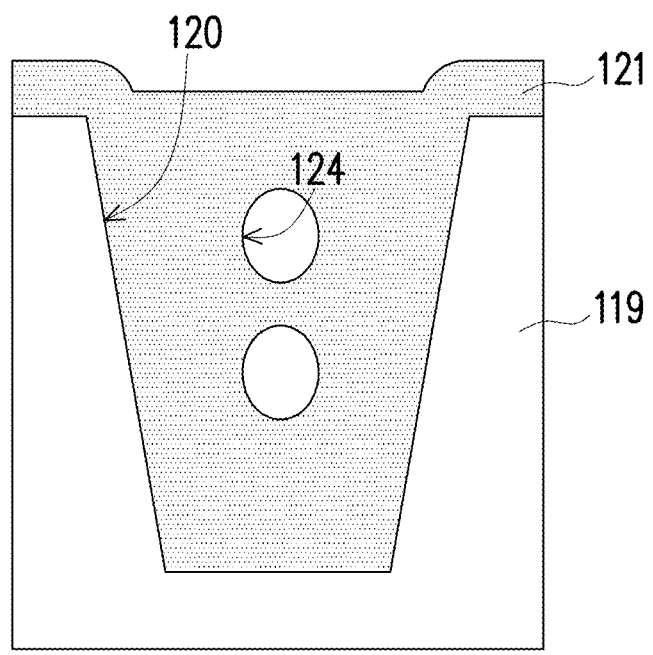

FIG. 6A shows a microscopic schematic of a film formed in a trench based on a known deposition method. FIG. 6B and FIG. 6C show schematics of a film formed in a trench based on a known deposition method.

Referring to FIG. 6A, a layer 13 has a trench (or a hole) 16, and a film 14 is formed in the trench using a known deposition method. The film 14 is, for instance, a metal material or a dielectric material. In some embodiments in which the trench 16 has a high aspect ratio, a grain 14a of the film 14 cannot be evenly filled in the trench 16, and an empty space 15 is formed in the film 14. The empty space 15 is, for instance, a hole or a seam.

Referring to FIG. 6B and FIG. 6C, a trench 120 is located in a layer 119, and the layer 119 and the trench 120 are similar to the layer 19 and the opening 20 shown in FIG. 4A in terms of material and structural properties and are not repeated herein. When a film 121 is formed in the trench 120 using a known deposition method, in some embodiments in which the trench 120 has a high aspect ratio, a seam 123 or a hole 124 is readily formed in the film 121.

Referring to FIG. 4B and FIG. 6A to FIG. 6C, in comparison to a known deposition method, the atomic layer deposition method of an embodiment of the invention has good filling capability when a metal layer is formed in a trench or a hole (in particular a trench or a hole having a high aspect ratio), and a film without any holes or seams is conformally formed in the trench or the hole, and therefore the yield of the element is increased.

The embodiments above are exemplified by the deposition of a metal (such as cobalt), but the invention is not limited thereto. The atomic layer deposition method of an embodiment of the invention may also be used to form a dielectric material or other metal materials. The dielectric material includes a nitride such as silicon nitride, silicon carbonitride, silicon oxynitride, or a combination thereof. The metal material is, for instance, cobalt, tungsten, copper, or a combination thereof.

Based on the above, the atomic layer deposition method of an embodiment of the invention provides better flatness (smaller surface roughness) and smaller atom grain size to the resulting film with the assistance of UV light irradiation. When a film is formed in a trench, in particular in a trench having a high aspect ratio, the trench is completely filled without the generation of any holes or seams.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An atomic layer deposition method, comprising:
placing a substrate in a reaction chamber,
performing at least one deposition cycle to deposit a metal film on the substrate, comprising:
introducing a metal precursor in the reaction chamber;
introducing a hydrogen plasma to be reacted with the metal precursor adsorbed on the substrate to form the metal film; and
performing an annealing process on the metal film,
wherein the at least one deposition cycle is performed in a hydrogen atmosphere under a UV light irradiation.

2. The atomic layer deposition method of claim 1, further comprising, in the at least one deposition cycle, after the metal precursor is introduced and before the hydrogen plasma is introduced, providing a first purge gas to purge the metal precursor not adsorbed on the substrate out of the reaction chamber, wherein the hydrogen is used as the first purge gas.

3. The atomic layer deposition method of claim 2, further comprising, in the at least one deposition cycle, after the hydrogen plasma is introduced, introducing a second purge gas to purge a reaction byproduct of the hydrogen plasma and the metal precursor and unreacted hydrogen plasma out of the reaction chamber, wherein the hydrogen is used as the second purge gas.

4. The atomic layer deposition method of claim 1, wherein a wavelength range of the UV light is 160 nm to 280 nm.

5. The atomic layer deposition method of claim 1, further comprising, when the at least one deposition cycle is performed, heating the substrate to 180° C. to 350° C.

6. The atomic layer deposition method of claim 1, wherein a temperature of the annealing process is 250° C.

7. The atomic layer deposition method of claim 1, wherein the metal film comprises a cobalt, and the metal precursor comprises $Co(CO)_3(NO)$.

8. The atomic layer deposition method of claim 7, wherein in the metal film, an atomic percentage of the cobalt is greater than 96.5%.

9. The atomic layer deposition method of claim 1, wherein a film thickness of the metal film is 5 nm, a surface roughness RMS of the metal film is 0.6 nm, and a metal grain size range of the metal film is 2.5 nm to 3 nm.

10. The atomic layer deposition method of claim 1, wherein a film thickness of the metal film is 100 nm, a surface roughness RMS of the metal film is 7.1 nm, and a metal grain size range of the metal film is 22 nm to 25 nm.

11. The atomic layer deposition method of claim 1, wherein after the annealing process is performed, a resistivity of the metal film at a thickness of 55 nm is 10 μΩ·cm to 13 μΩ·cm.

12. The atomic layer deposition method of claim 1, wherein the metal film is conformally filled in a trench, and an aspect ratio of the trench is 12:1.

* * * * *